(12) United States Patent
Nakamura et al.

(10) Patent No.: US 7,782,220 B2
(45) Date of Patent: Aug. 24, 2010

(54) PROXIMITY SENSOR AND PROXIMITY SENSING METHOD

(75) Inventors: Yasushi Nakamura, Chiba (JP); Nobumasa Misaki, Chiba (JP)

(73) Assignee: Fujikura Ltd., Tokyo (JP)

( * ) Notice: Subject to any disclaimer, the term of this patent is extended or adjusted under 35 U.S.C. 154(b) by 345 days.

(21) Appl. No.: 11/753,935

(22) Filed: May 25, 2007

(65) Prior Publication Data

US 2008/0252474 A1 Oct. 16, 2008

(30) Foreign Application Priority Data

| May 26, 2006 | (JP) | ............................. 2006-146843 |
| Mar. 30, 2007 | (JP) | ............................. 2007-090278 |
| Apr. 27, 2007 | (JP) | ............................. 2007-119009 |

(51) Int. Cl.
  *G08B 13/26* (2006.01)
(52) U.S. Cl. .............................. 340/686.6; 340/539.23; 340/530; 340/545.4; 324/658
(58) Field of Classification Search .................. 340/562, 340/686.6, 539.23, 530, 545.5; 324/658–690; 341/33
See application file for complete search history.

(56) References Cited

U.S. PATENT DOCUMENTS

| 4,065,715 | A | * | 12/1977 | Jaffe et al. ................... 324/678 |
| 4,642,555 | A | * | 2/1987 | Swartz et al. ................ 324/677 |
| 5,081,406 | A | * | 1/1992 | Hughes et al. .............. 318/478 |
| 5,508,700 | A | * | 4/1996 | Taylor et al. ................... 341/33 |
| 5,554,973 | A | * | 9/1996 | Kawashima et al. ........ 340/562 |
| 6,079,738 | A | * | 6/2000 | Lotito et al. ................. 280/735 |
| 6,366,099 | B1 | * | 4/2002 | Reddi .......................... 324/678 |
| 6,452,514 | B1 | * | 9/2002 | Philipp ........................ 341/33 |
| 2006/0055415 | A1 | * | 3/2006 | Takita ........................ 324/658 |

FOREIGN PATENT DOCUMENTS

JP 2002-014174 A 1/2002

* cited by examiner

*Primary Examiner*—Daniel Wu
*Assistant Examiner*—Nay Tun
(74) *Attorney, Agent, or Firm*—Sughrue Mion, PLLC

(57) ABSTRACT

A proximity sensor includes a sense electrode having a first capacitance to ground, wherein the first capacitance varies in response to proximity of an object to be sensed; a first sense circuit which provides a first pulse signal having a pulse width determined in accordance with the first capacitance; a reference capacitor; a second sense circuit which provides a second pulse signal having a pulse width determined in accordance with a second capacitance of the reference capacitor; and a computing circuit which computes a difference pulse by subtracting the second pulse signal from the first pulse signal and provide a pulse of the difference pulse width.

14 Claims, 14 Drawing Sheets

PROXIMITY SENSOR AND PROXIMITY SENSING METHOD

CROSS REFERENCE TO RELATED APPLICATIONS

This application claims priority from prior Japanese Patent Applications No. 2006-146843 filed on May 26, 2006, No. 2007-90278 filed on Mar. 30, 2007, and No. 2007-119009 filed on Apr. 27, 2007, the entire contents of which are incorporated herein by reference.

BACKGROUND OF THE INVENTION

1. Field of the Invention

The present invention relates to a proximity sensor and proximity sensing method for detecting proximity of an object to be sensed based on a variation in capcitance between a sense electrode and ground.

2. Description of the Related Art

As known in the art, there have been sensors for sensing proximity of an object. The sensors of such the type can sense proximity of the object by detecting frequency or duty ratio which vary in response to the capacitance between a sensor portion or sense electrode and ground (see, for example, JP 2002-14174A, paragraphs 0082-0089, FIGS. 8 and 9). Such proximity sensors have a problem, however, because the detected value is easily influenced by ambient environmental factors such as temperatures, humidity, and extraneous noise. Therefore, the above-described sensor is provided with a thermistor or a semiconductor temperature sensor that exhibits a certain temperature characteristic for compensation of the temperature dependence of an analog circuit.

In addition to the increased cost of adding a thermistor or a semiconductor temperature sensor, the above-described sensor has another problem because it is difficult to match the temperature characteristic of the thermistor or semiconductor temperature sensor with temperature characteristics of the analog circuit. In addition, the above-described sensor which detects the variation in capacitance of the sense electrode provides a variable component, which is superimposed on an initial capacitance of the sense electrode or the analog circuit. Further, the value of the sensed output voltage from the sense circuit is dependent on the supply voltage and is finite. Therefore, if the output value has an upper limit equal to the supply voltage, it is only possible to use the value of the voltage range that remains after subtracting the value of the initial capacity from the supply voltage. Thus, the dynamic range can not be made large enough to perform high-precision detection.

SUMMARY OF THE INVENTION

Exemplary embodiments of the present invention overcome the disadvantages described above and other disadvantages not described above. Also, the present invention is not required to overcome the disadvantages described above, and an exemplary embodiment of the present invention may not overcome any of the problems described above.

An aspect of the present invention provides a proximity sensor comprising: a sense electrode having a capacitance to ground, wherein the capacitance is variable in response to proximity of an object to be sensed; a first sense circuit which provides a first pulse signal having a pulse width determined in accordance with the capacitance between the sense electrode and ground; a reference capacitor; a second sense circuit which provides a second pulse signal having a pulse width determined in accordance with the capacitance of the reference capacitor; and a computing means which computes a difference pulse width by subtracting the second pulse signal from the first pulse signal and provides a pulse width of the difference pulse.

The first aspect of the proximity sensor, also provides that the reference capacitor has an environmental characteristic equal to that of the sense electrode allowing the use of simple circuitry to achieve a high-precision compensation for the environmental characteristic.

Another aspect of the present invention provides a proximity sensor comprising: a sense electrode having a capacitance to ground, wherein the capacitance is variable in response to proximity of an object to be sensed; a first sense circuit which provides a first pulse signal having a pulse width determined in accordance with the capacitance between the sense electrode and ground; a reference electrode; a second sense circuit which provides a second pulse signal having a pulse width determined in accordance with the capacitance between the reference electrode and ground; and a computing means which computes a difference pulse by subtracting the second pulse signal from the first pulse signal and provides a pulse having the difference pulse width.

The second aspect of the proximity sensor also provides arranging the sense electrode in the vicinity of the reference electrode making it possible to exclude extraneous influences equally and allowing the use of simple circuitry to achieve a high-precision compensation for the extraneous influences.

The second aspect of the proximity sensor also provides that the reference electrode may be configured to have a capacitance to ground, wherein the capacitance is variable in response to proximity of an object to be sensed. Such a configuration allows the reference electrode to be used also as a second sense electrode.

Aspects of the proximity sensor also provide that the second pulse signal output from the second sense circuit may have an initial value almost equal to the initial value of the first pulse signal output from the first sense circuit. Such a configuration makes it possible to extract only a variable component after the initial capacitance of the first sense circuit is subtracted. Even in an electric circuit only permitted to take a finite value with an upper limit equal to the supply voltage, taking only the variable component can facilitate signal processing in the following stage.

Aspects of a proximity sensors may further provide a trigger signal generator circuit which synchronizes the rising edges of the first pulse signal and the second pulse signal with each other. The synchronization between the pulse signals enables the detected signal waveform to be synchronized with the reference signal waveform and thus facilitates the subtraction operation at the pulse level.

Aspects of the proximity sensors may further provide a delay circuit which delays the first pulse signal relative to the second pulse signal. Additional aspects may provide a low-pass filter which converts the difference pulse into a DC signal; and a DC amplifier which amplifies the DC signal created through the low-pass filter. Inserting a circuit which intentionally delays its pulse signal may prevent a glitch from occurring on a logical subtraction. In addition, converting the difference value into a DC signal makes it possible to extract only the variable component. It is possible to execute amplification and signal processing on the following stage and sense an extremely small variation.

Aspects of the proximity sensors may provide comparison of the pulse width of the difference pulse with a threshold and provide an ON/OFF signal based on a magnitude relation therebetween. Converting the difference value into a DC signal makes it possible to extract only the variable component.

Amplification and signal processing in the following stage may make it possible to provide an ON/OFF output even in response to an extremely small variation in the detected signal.

Aspects of the proximity sensors may provide a sense electrode configured to be one of a plurality of such sense electrodes. In this case, the sensor may further comprise a selector circuit which selects one of signals from the plurality of sense electrodes and feeds it to the first sense circuit.

Aspects of the present invention provide a proximity sensing method, comprising: receiving a first pulse signal having a first pulse width determined in accordance with a capacitance between a sense electrode having a capacitance to ground, wherein the capacitance is variable in response to proximity of an object to be sensed and ground to measure the first pulse width; receiving a second pulse signal having a second pulse width determined in accordance with a capacitance of a reference capacitor to measure the second pulse width; and computing a difference pulse by subtracting the second pulse width of the second pulse signal from the first pulse width of the first pulse signal and providing a pulse width of the difference pulse.

Aspects of the present invention provide a proximity sensing method, comprising: receiving a first pulse signal having a first pulse width determined in accordance with a capacitance between a sense electrode having a capacitance to ground, wherein the capacitance is variable in response to proximity of an object to be sensed and ground to measure the first pulse width; receiving a second pulse signal having a second pulse width determined in accordance with a capacitance between a reference electrode and ground to measure the second pulse width; and computing a difference pulse by subtracting the second pulse width of the second pulse signal from the first pulse width of the first pulse signal and providing a pulse width of the difference pulse.

DETAILED DESCRIPTION OF THE EXEMPLARY EMBODIMENTS

The exemplary embodiments of the present invention will now be described with reference to the accompanying drawings.

Figure 1:
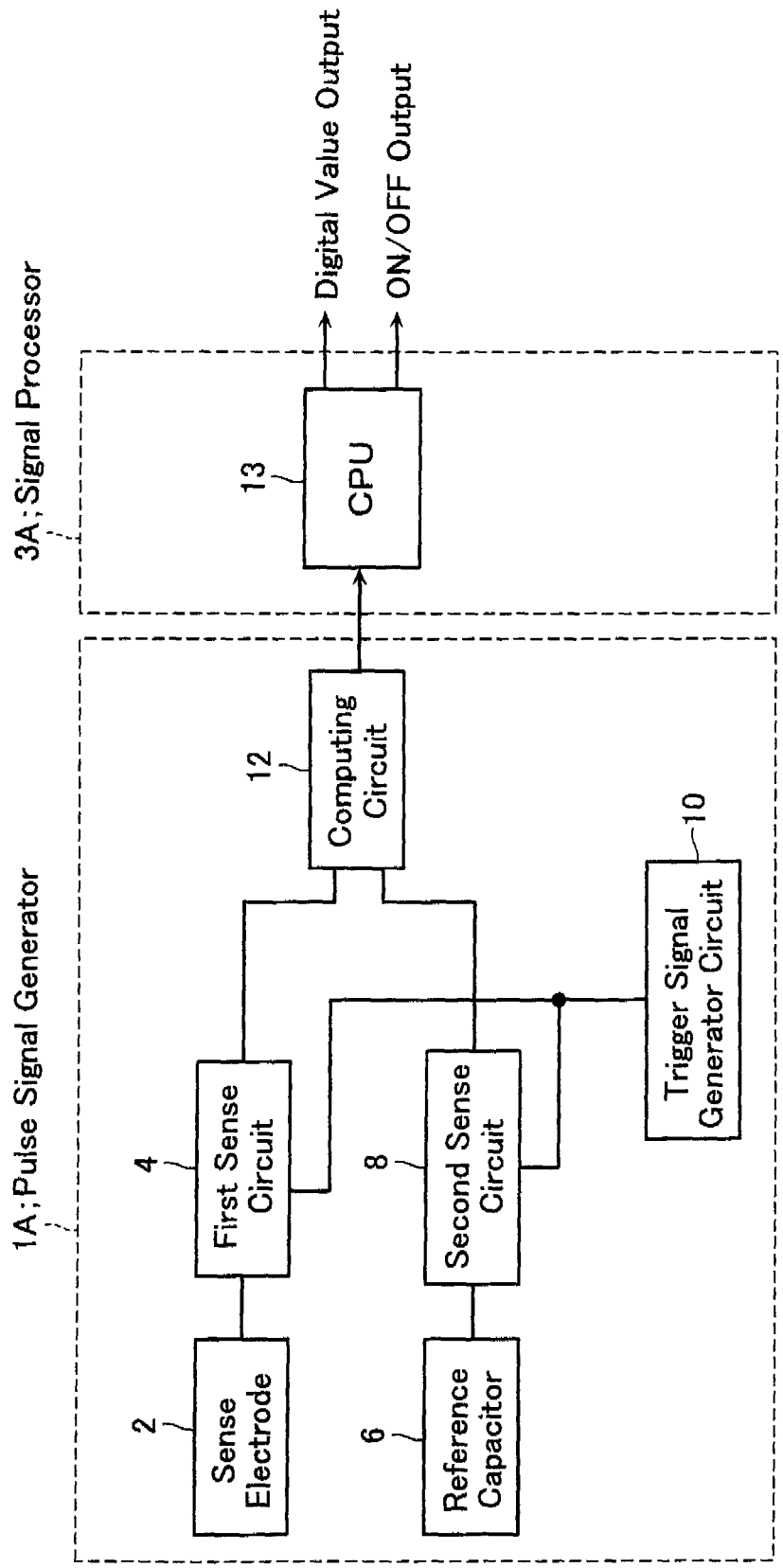
FIG. 1 is a block diagram illustrating an electrical configuration of a proximity sensor according to a first exemplary embodiment.

FIG. 1 is a block diagram illustrating an electrical configuration of a proximity sensor according to a first exemplary embodiment of the present invention.

The proximity sensor comprises a pulse signal generator 1A that generates a pulse signal having a duty ratio which varies in response to proximity of an object to be sensed. It also comprises a signal processor 3A that executes signal processing for the generated pulse signal to provide an output value in response to the duty ratio, and provides an external ON/OFF output.

The pulse signal generator 1A includes a sense electrode 2; a first sense circuit 4 that provides a sense pulse signal P1 having a pulse width determined in accordance with a capacitance between the sense electrode 2 and ground; a reference capacitor 6; a second sense circuit 8 that provides a reference pulse signal P2 having a pulse width determined in accordance with the capacitance of the reference capacitor 6; a trigger signal generator circuit 10 that supplies a trigger signal TG to the first sense circuit 4 and the second sense circuit 8 to synchronize the rising edges of the sense pulse signal P1 and the reference pulse signal P2; and a computing circuit 12 that computes a difference pulse signal P3 based on the sense pulse signal P1 fed from the first sense circuit 4 and the reference pulse signal P2 fed from the second sense circuit 8.

The sense electrode 2 is located in an area where it can sense proximity of an object such as a human body. The capacitance Cx between the sense electrode 2 and ground varies in accordance with proximity of the object. The first sense circuit 4 is configured to operate in synchronization with the trigger signal TG fed from the trigger signal generator circuit 10 to generate the sense pulse signal P1 having a duty ratio variable in response to the capacitance Cx between the sense electrode 2 and ground. The generated sense pulse signal P1 is supplied to the computing circuit 12.

The capacitance Cref of the reference capacitor 6 can not be varied in response to proximity of the object. The second sense circuit 8 is configured to operate in synchronization with the trigger signal TG fed from the trigger signal generator circuit 10 to generate the reference pulse signal P2 having a duty ratio determined in accordance with the capacitance Cref of the reference capacitor 6. The generated reference pulse signal P2 is supplied to the computing circuit 12.

The computing circuit 12 subtracts the reference pulse signal P2 from the supplied sense pulse signal P1 to provide the difference pulse signal P3 (=P1−P2). The difference pulse signal P3 is fed to the signal processor 3A.

The signal processor 3A comprises a CPU 13 that converts a pulse signal into a digital value and provides it as an external output and also provides an external ON/OFF output based on this digital value. More particularly, the CPU 13 converts the supplied difference pulse signal P3 into the digital value in response to the duty ratio and provides it as a digital signal. It also provides the ON/OFF output based on this digital signal to switch between ON/OFF states of the proximity sensor. The CPU 13 may also be configured as a logic circuit.

In the proximity sensor thus configured, when an object approaches the sense electrode 2, the capacitance Cx of the sense electrode 2 to ground via the object varies to change the duty ratio of the sense pulse signal P1. The duty ratio of the sense pulse signal P1 may also fluctuate in accordance with environmental variations such as temperatures, humidity, and extraneous noises. The duty ratio of the reference pulse signal P2 output from the second sense circuit 8 on the other hand can not vary in response to proximity of the object and has dependence only on ambient environments such as temperatures and humidity. The computing circuit 12 subtracts the reference pulse signal P2 from the sense pulse signal P1 to remove influences of ambient environments, such as temperatures and humidity, exerted on the sense pulse signal P1. It provides the difference pulse signal P3 that varies only in response to proximity of the object.

Figure 2:
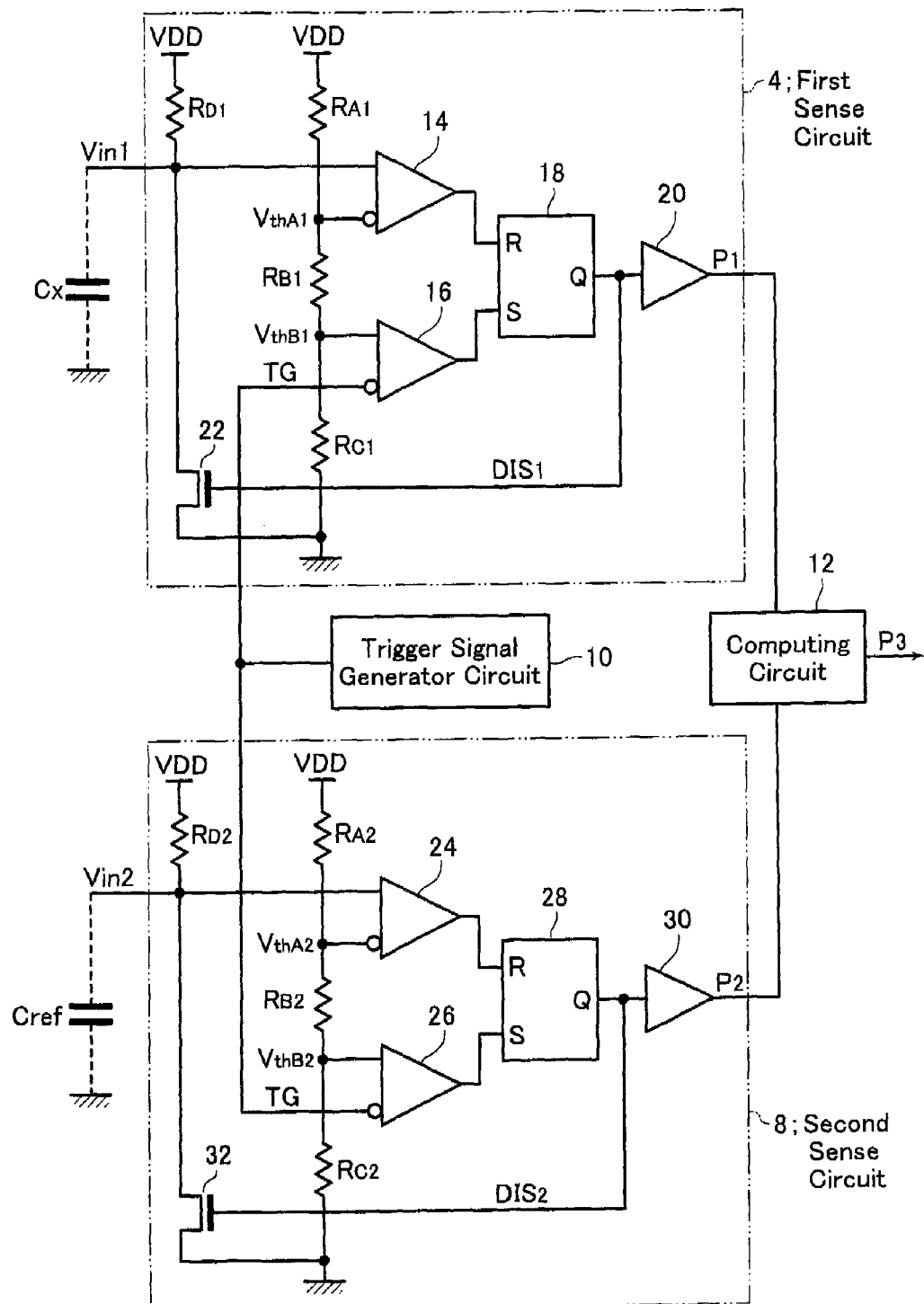
FIG. 2 is a circuit diagram illustrating partial circuitry of the proximity sensor according to the first exemplary embodiment.

FIG. 2 is a circuit diagram illustrating a circuitry example of the pulse signal generator 1A in the proximity sensor according to the first exemplary embodiment.

The first sense circuit 4 for generating the sense pulse signal P1 in accordance with the capacitance Cx between the sense electrode 2 and ground is configured similarly to the second sense circuit 8 for generating the reference pulse signal P2 in accordance with the capacitance of the reference capacitor 6.

The first sense circuit 4 includes two comparators 14, 16; a RS flip-flop circuit (hereinafter referred to as "RS-FF") 18 having a reset terminal R and a set terminal S respectively supplied with outputs from the comparators 14, 16; a buffer 20 that passes an output DIS1 from the RS-FF 18 therethrough; and a transistor 22 that is ON/OFF-controlled with the output DIS1 from the RS-FF 18.

Figure 3:
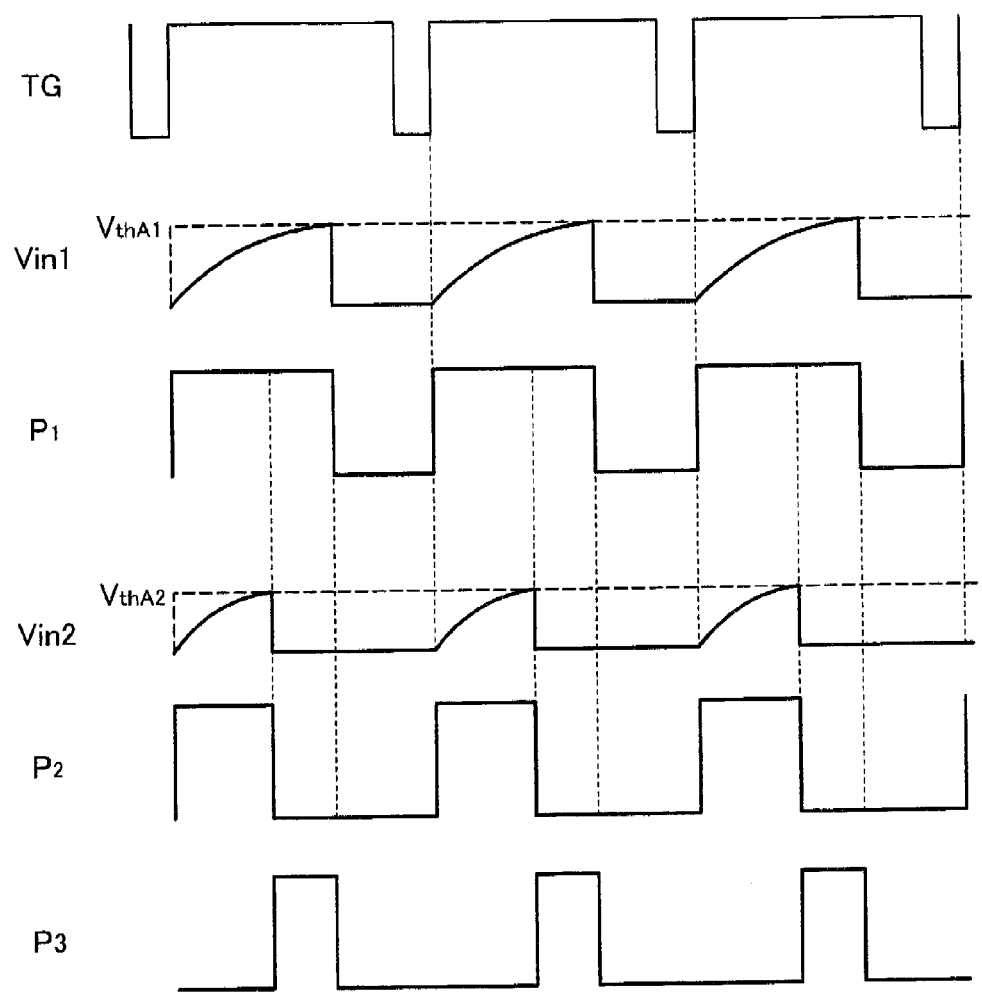
FIG. 3 is a timing chart for a circuitry example of the proximity sensor according to the first exemplary embodiment.

The comparator 16 compares the trigger signal TG output from the trigger signal generator circuit 10 as shown in FIG. 3 with a certain threshold VthB1 created by voltage divider resistors RA1, RB1, RC1 and provides a set pulse in synchronization with the trigger signal TG. The set pulse sets the Q-output from the RS-FF 18. The Q-output serves as the discharge signal DIS1 to bring the transistor 22 into the OFF-state. While the transistor 22 is kept off, the capacitance between the sense electrode 2 and ground can be charged at a rate determined from a time constant, which is derived from the capacitance Cx of the sense electrode 2 to ground and a resistor RD1 connected between an input terminal of the comparator 14 and a supply line. Thus, the potential of an input signal Vin1 rises at a rate determined from the capacitance Cx. In this case, when the input signal Vin1 exceeds a threshold VthA1 determined from the voltage divider resistors RA1, RB1, RC1, the comparator 14 inverts the output thereof to turn the output from the RS-FF 18. As a result, the transistor 22 is brought into the ON-state, which discharges the charge on the sense electrode 2 through the transistor 22. Therefore, the first sense circuit 4 provides the sense pulse signal P1 that oscillates at a duty ratio based on the capacitance Cx between the sense electrode 2 and ground. The sense pulse signal P1 thus generated is supplied to the computing circuit 12.

Similarly, the second sense circuit 8 includes two comparators 24, 26; an RS-FF 28 having a reset terminal R and a set terminal S respectively supplied with outputs from the comparators 24, 26; a buffer 30 that passes an output DIS2 from the RS-FF 28 therethrough; and a transistor 32 that is ON/OFF-controlled with the output DIS2 from the RS-FF 28. This is a timer.

The comparator 26 compares the trigger signal TG output from the trigger signal generator circuit 10 with a certain threshold VthB2 created by the voltage divider resistors RA2, RB2, RC2 and provides a set pulse in synchronization with the trigger signal TG. The set pulse sets the Q-output from the RS-FF 28, which serves as the discharge signal DIS2 to bring the transistor 32 into the OFF-state. Thus, the potential of an input signal Vin2 rises at a rate determined from the capacitance Cref and a resistor RD2 connected between an input terminal of the comparator 24 and the supply line. In this case, when the input signal Vin2 exceeds a threshold VthA2, the transistor 32 is brought into the ON-state to discharge the charge on the reference capacitor 6. Therefore, the sense circuit 8 provides the reference pulse signal P2 that oscillates at a duty ratio based on the capacitance Cref of the reference capacitor 6. The reference pulse signal P2 thus generated is supplied to the computing circuit 12.

The computing circuit 12 subtracts the reference pulse signal P2 from the supplied sense pulse signal P1 and provides the difference pulse signal P3 as shown in FIG. 3. The difference pulse signal P3 can be derived, for example, from the logical product of the sense pulse signal P1 and the inverted pulse of the reference pulse signal P2.

If the two sense circuits 4, 8 have almost same ambient environmental characteristics, subtracting the reference pulse signal P2, which is output from the second sense circuit 8 that depends only on the ambient environment, from the sense pulse signal P1 makes it possible to remove influences such as temperature and humidity. Thus, it is possible to execute a high-precision capacitance detection with a simple configuration.

Figure 4:
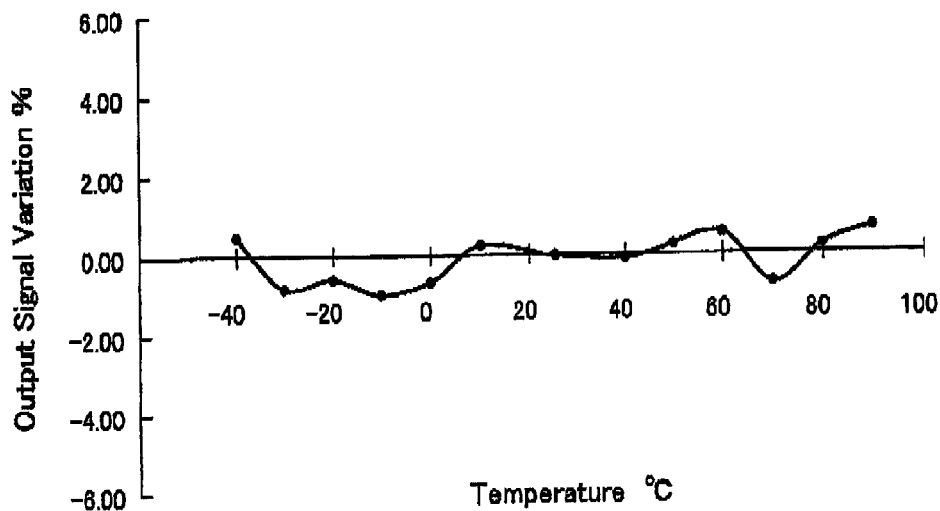
FIG. 4 illustrates a relation between the ambient temperature and the variation.

The following description is given to a verification experiment performed to verify the effect of the present invention using the proximity sensor according to the first exemplary embodiment. A 20 pF capacitor is connected as the sense electrode 2, and a of 15 pF capacitor is connected as the reference capacitor 6. The ambient temperature around the proximity sensor thus configured was varied from −40° C. to 90° C. to check variations in the digital signal output from the CPU 13. FIG. 4 shows a relation between the ambient temperature and the variation in the output value while the ambient temperature is varied at intervals of 10° C. The variation is shown with reference to the digital signal output value at 25° C. As a result, the variation in the digital signal output value was within ±1% at from −40° C. to 90° C. The digital signal output value is not varied in accordance with the temperature. Thus, it is confirmed that the influence of the temperature dependence can be removed.

In order that the initial pulse width of the sense pulse signal P1 output from the first sense circuit 4 may have the same value as the initial pulse width of the reference pulse signal P2 output from the second sense circuit 8 while no object is sensed, the capacitance Cref of the reference capacitor 6 can be adjusted.

Figure 5:
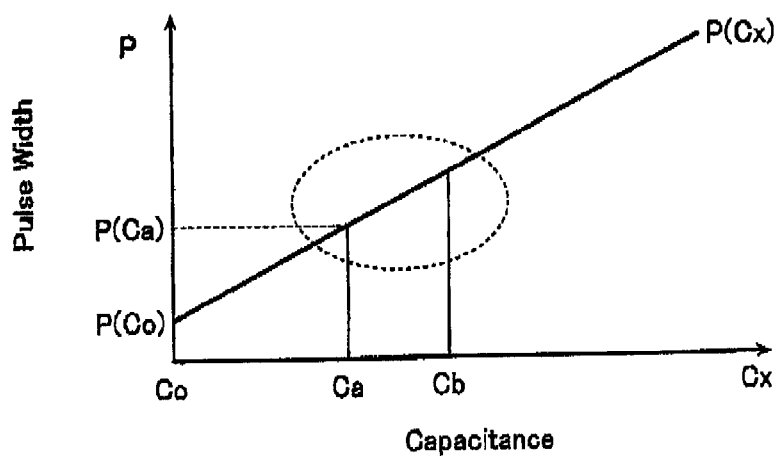
FIG. 5 is a graph illustrating the capacity of a sense electrode in the proximity sensor according to the first exemplary embodiment and the pulse width of a pulse signal to be detected.

FIG. 5 is a graph illustrating a relation between the capacitance of the sense electrode 2 and the pulse width of the pulse signal to be detected. The abscissa indicates the capacitance Cx between the sense electrode 2 and ground. The ordinate indicates the pulse width of the pulse signal P1 output from the first sense circuit 4.

If no object approaches the sense electrode 2 and the initial capacitance between the sense electrode 2 and ground is equal to Co, the pulse width of the pulse signal to be detected is equal to P(Co). When an object approaches the sense electrode 2, a variation ΔCx in the capacitance Cx increases the width of the sense pulse signal P1 accordingly. Namely, the pulse width of the sense pulse signal P1 becomes P(Co+ΔCx). If the pulse width P(Co) determined from the initial capacitance of the sense electrode 2 is relatively large and the variation P(ΔCx) in the pulse width due to the capacitance variation is relatively small, the dynamic range of the amplifier circuit can not be made larger. In such the case, even though the amplifier circuit executes amplification, the variation in the pulse width can not be detected precisely.

The capacitance of the reference capacitor 6 is adjusted such that the pulse width P(Co) determined from the initial capacity of the sense electrode 2 is made equal to the pulse width of the reference pulse signal P2. In other words, Cref is selected to satisfy P(Cref)=P(Co). As the first sense circuit 4 and the second sense circuit 8 also have initial capacitances, it is required to estimate these capacitances for setting the value of Cref.

In such the condition, the difference pulse signal P3, which is a difference between the sense pulse signal P1 and the reference pulse signal P2, is represented by P3=P(Co+ΔCx)−P(Cref), that is, P3=P(ΔCx) (∵P(Co)=P(Cref)).

In this way, the generated difference pulse signal P3 reflects only the capacitance variation in accordance with the proximity of the object to the sense electrode 2. In this case, the amplifier circuit may be designed to have a wider dynamic range to amplify the variation such that the variation in the sense pulse signal P1 can be detected reliably even if it is extremely small. It is possible to perform high-precision sensing with a simple circuitry and without the use of an expensive element to measure a variation in the extremely small signal intensity.

In the sense electrode 2, it may be desired to detect a capacity variation within a certain section determined from the relation to the object. For example, it may be desired to detect a variation in Cx from Ca to Cb in FIG. 5. In this case, to prevent detection of a capacitance variation below Ca, the capacitance of the reference capacitor may be selected such that Cref satisfies P(Cref)=P(Ca). When the capacitance associated with the sense electrode 2 stays between Co and Ca, the difference pulse signal P3 obtained by subtracting the reference pulse signal P2 from the sense pulse signal P1 can not be detected. If the capacitance of the sense electrode 2 is larger than Ca, the difference pulse signal P3 obtained by subtracting the reference pulse signal P2 from the sense pulse signal P1 can take a value that reflects a variation from Ca. The upper limit value Cb corresponds to the capacitance when the object touches the sense electrode 2.

With such the configuration, it is made possible to measure a variation precisely within a certain section in the sense electrode. The capacitance variation from Co to Ca may be employed as a noise margin to add a capacitance variation equal to the extraneous noise mixed in the sense electrode to the reference capacitor, thereby improving the noise immunity.

Figure 6:
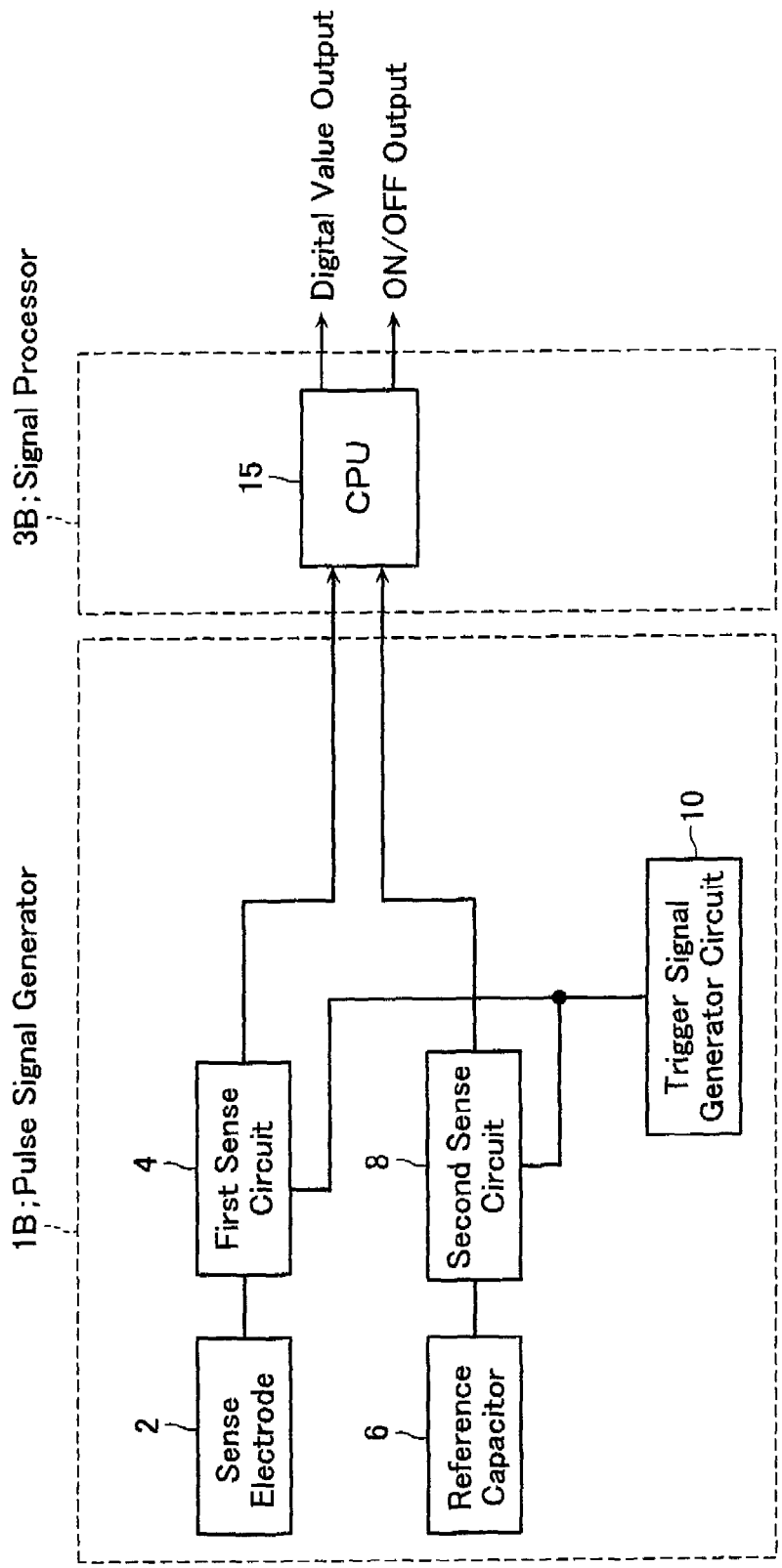
FIG. 6 is a block diagram illustrating an electrical configuration of a proximity sensor according to a second exemplary embodiment.

A proximity sensor according to a second exemplary embodiment of the present invention is described next. FIG. 6 is a block diagram illustrating an electrical configuration of the proximity sensor according to the second exemplary embodiment. The proximity sensor according to the second exemplary embodiment comprises a pulse signal generator 1B and a signal processor 3B.

The pulse signal generator 1B does not include a computing circuit 12, and as such is different from the pulse signal generator 1A in the first exemplary embodiment. The pulse signal generator 1B supplies the sense pulse signal P1 generated from the first sense circuit 4 and the reference pulse signal P2 generated from the second sense circuit 8 to the signal processor 3B.

The signal processor 3B comprises a CPU 15. The CPU 15 converts the supplied sense pulse signal P1 and reference pulse signal P2 into digital values and computes a difference value between the two digital values, different from the CPU 13 in the first exemplary embodiment. The CPU 15 provides the difference value as an external digital value and provides an ON/OFF output based on this digital value, similar to the CPU 13 in the first exemplary embodiment.

Figure 7:
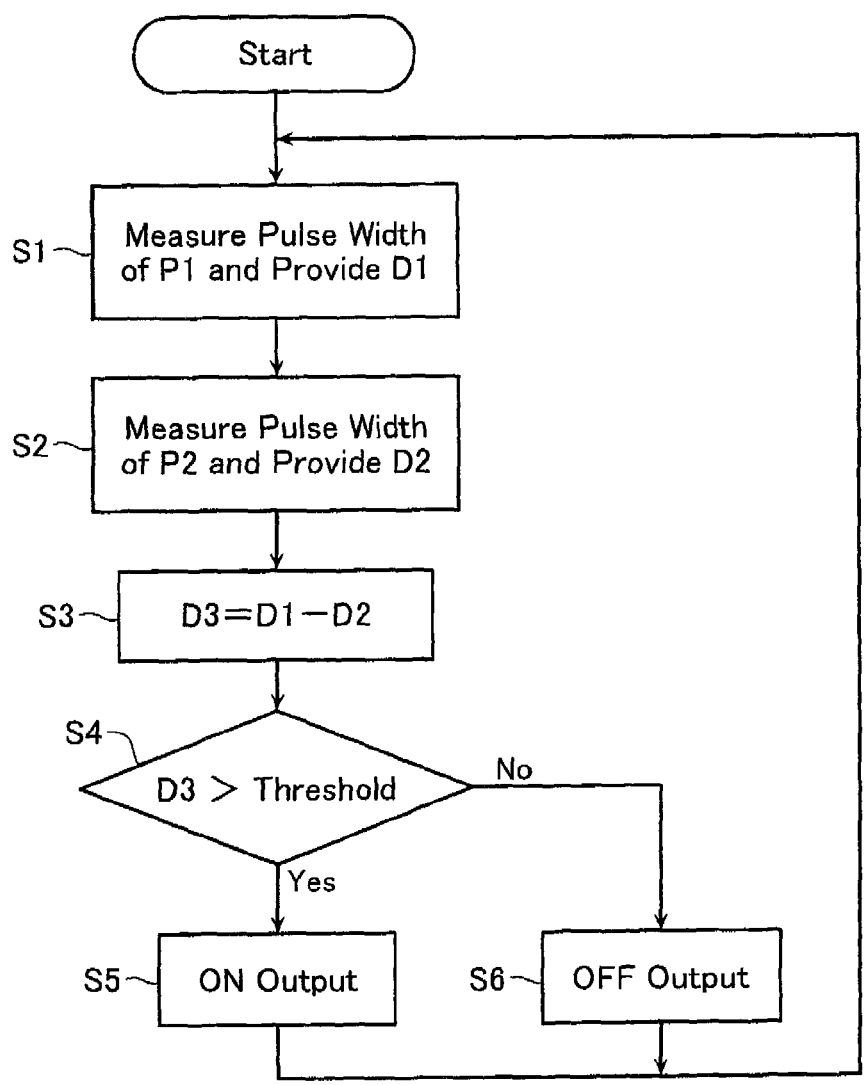
FIG. 7 is a flowchart illustrating an example of processing in a CPU to provide an ON/OFF output.

Processing in the signal processor 3B is described with reference to FIG. 7. FIG. 7 is a flowchart illustrating an example of processing in the CPU 15 to provide the ON/OFF output. The CPU 15 receives the sense pulse signal P1 and reference pulse signal P2 generated from the pulse signal generator 1B. At S1, the CPU 15 measures the pulse width of the supplied sense pulse signal P1 and creates a sense digital signal D1. At S2, the CPU 15 similarly measures the pulse width of the supplied reference pulse signal P2 and creates a reference digital signal D2. At S3, the CPU 15 subtracts the reference digital signal D2 from the sense digital signal D1 to yield a difference digital signal D3, which corresponds to the width of the difference pulse and is provided as an external digital value. At S4, the CPU 15 compares the created difference digital signal D3 with a previously determined threshold. In the present exemplary embodiment, if the difference digital signal D3 is higher than the determined threshold, the flow proceeds to S5 to provide an ON-output. In contrast, if the difference digital signal D3 is lower than the determined threshold, the flow proceeds to S6 to provide an OFF-output. The CPU 15 repeats this processing while the proximity sensor operates.

Processing the sense pulse signal P1 and the reference pulse signal P2 in the signal processor 3B using the CPU 15 can eliminate the need for providing a computing circuit in the pulse signal generator and thus simplify the configuration of the pulse signal generator. In addition, it is possible to identify whether the difference digital value is positive or negative and to flexibly set the threshold including the upper and lower limits.

Instead of the trigger signal TG generated at the trigger signal generator circuit 10, the output signal from the CPU may be employed. Besides the CPU 15 that measures the sense pulse signal P1 and the reference pulse signal P2, an AD converter may be employed to measure the pulse widths of the sense pulse signal P1 and the reference pulse signal P2 and provide them as digital values.

Figure 8:
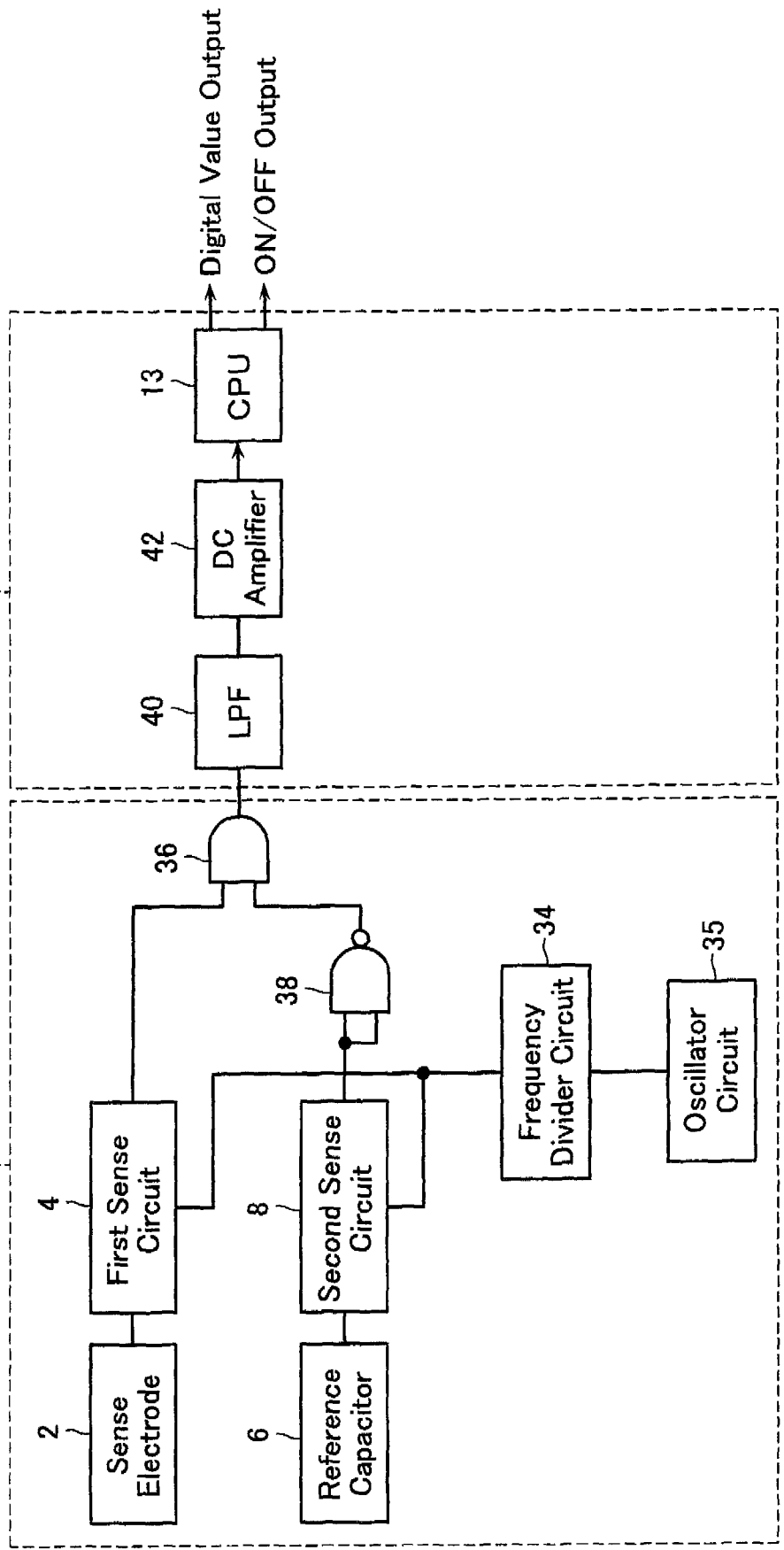
FIG. 8 is a block diagram illustrating an electrical configuration of a proximity sensor according to a third exemplary embodiment.

FIG. 8 is a block diagram illustrating an electrical configuration of the proximity sensor according to the third exemplary embodiment. The proximity sensor according to the third exemplary embodiment comprises a pulse signal generator 1C and a signal processor 3C.

In this exemplary embodiment the signal processor 3C includes on the front stage of the CPU 13 a low-pass filter (LPF) 40 and a DC amplifier 42 to convert the generated difference pulse signal P3 into an analog signal. The trigger signal generator circuit 10 in FIG. 1 includes an oscillator circuit 35, and a frequency divider circuit 34 that divides the frequency of the output from the oscillator circuit 35 to generate the trigger signal TG. The oscillator circuit 35 can internally oscillate and may be connected to an external quartz or ceramic oscillator. The computing circuit 12 of FIG.

1 includes an inverter 38 that inverts the reference pulse signal P2 output from the second sense circuit 8, and an AND circuit 36 that yields a logical product of the sense pulse signal P1 output from the first sense circuit 4 and the output from the inverter 38.

The difference pulse signal P3 output from the AND circuit 36 is converted into a DC voltage through the LPF 40 and amplified and fed into the CPU 13 through the DC amplifier 42. On the basis of this signal, the CPU 13 provides a digital value output and an ON/OFF output.

The difference pulse signal P3 is converted into DC in this way to lower the initial value of the voltage accordingly. Thus, it is possible to increase the amplification of the DC amplifier 42 on the rear stage, compared to the case where the pulse containing the initial capacitance is converted into DC, thereby enabling a large dynamic range, high-precision detection. The signal processor 3C uses the LPF 40 to smooth the difference pulse signal P3 to remove a glitch caused from a time difference between rises of the sense pulse signal P1 and the reference pulse signal P2.

Figure 9:
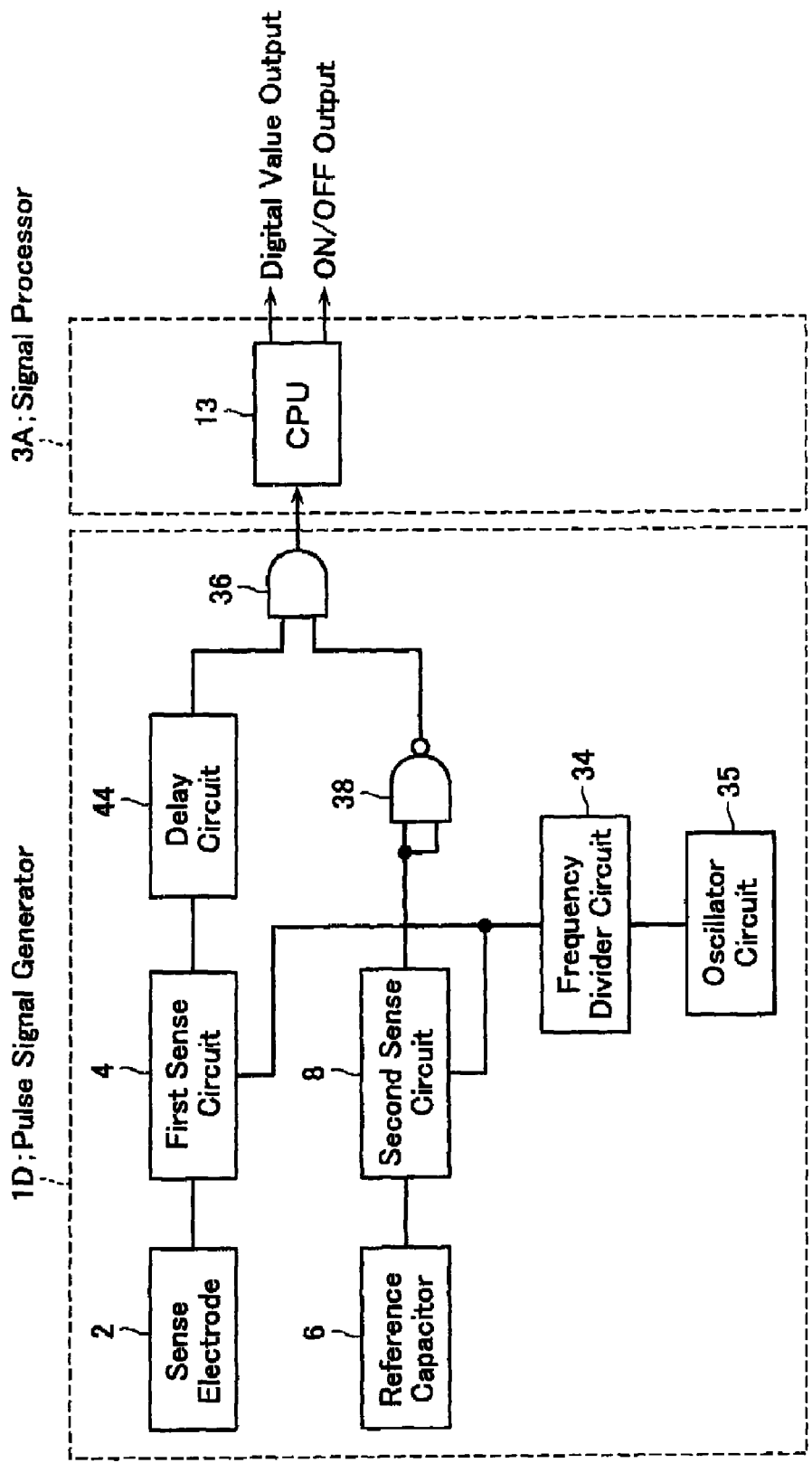
FIG. 9 is a block diagram illustrating an electrical configuration of a proximity sensor according to a fourth exemplary embodiment.

FIG. 9 is a block diagram illustrating an electrical configuration of the proximity sensor according to the fourth exemplary embodiment.

The proximity sensor according to the fourth exemplary embodiment comprises a pulse signal generator 1D and a signal processor 3A.

The pulse signal generator 1D includes a delay circuit 44 to remove a glitch. The delay circuit 44 slightly delays the sense pulse signal P1 output from the first sense circuit 4 relative to the reference pulse signal P2 output from the second sense circuit 8.

As a result, it is possible to remove a glitch caused from a time difference between rises of the sense pulse signal P1 and the reference pulse signal P2.

As another glitch removal means a flip-flop circuit may be provided, and a sample clock may be fed into the flip-flop circuit to configure a synchronous sampling circuit that can sample the pulse signals P1, P2. An alternative may also be configured to synchronize the outputs from the first sense circuit 4 and the second sense circuit 8 with each other and provide them externally.

Figure 10:
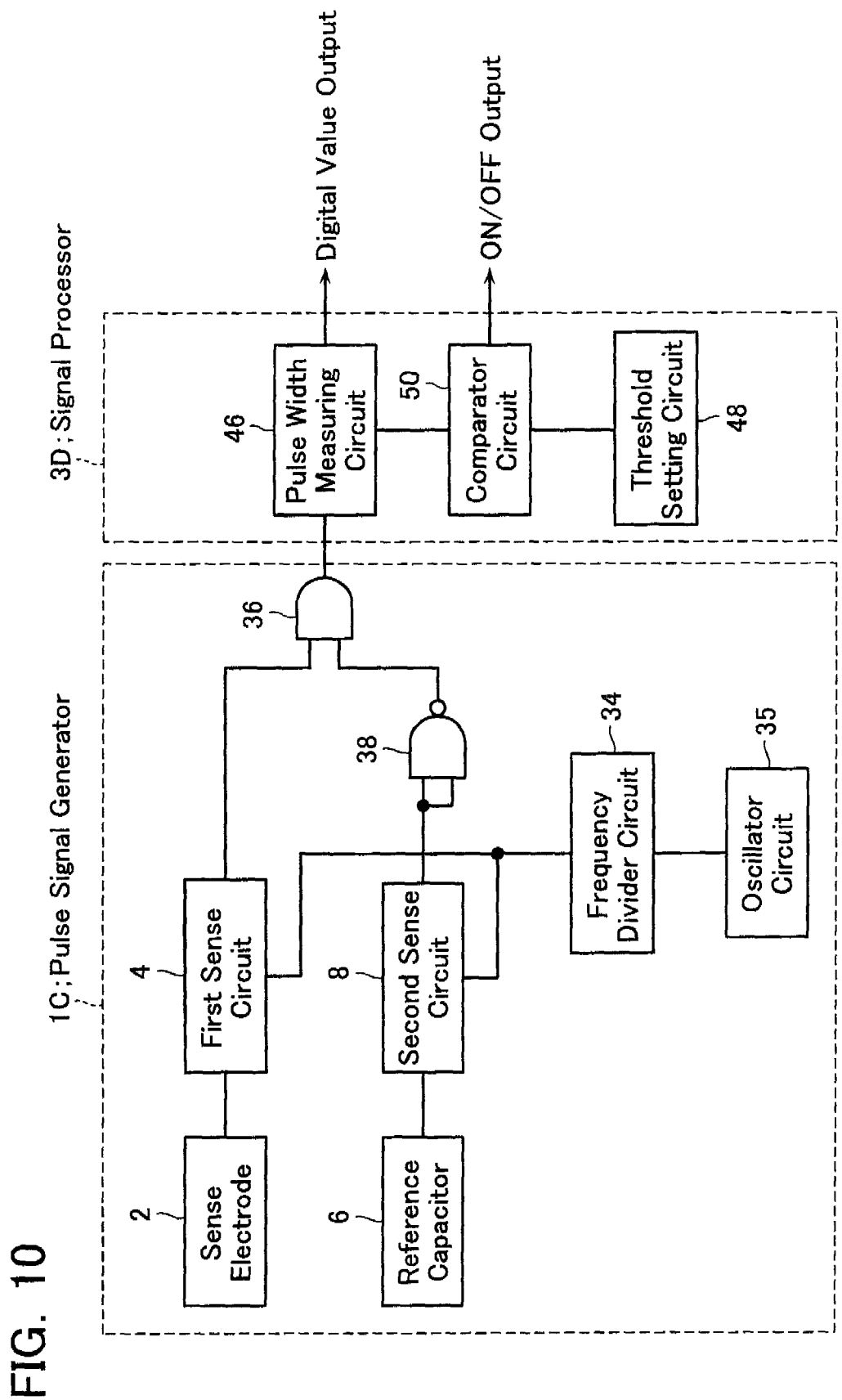
FIG. 10 is a block diagram illustrating an electrical configuration of a proximity sensor according to a fifth exemplary embodiment.

FIG. 10 is a block diagram illustrating an electrical configuration of the proximity sensor according to the fifth exemplary embodiment.

The proximity sensor according to the fifth exemplary embodiment comprises a pulse signal generator 1C and a signal processor 3D. The pulse signal generator 1C has the same configuration as that in the third exemplary embodiment. The signal processor 3D includes a pulse width measuring circuit 46 that converts the pulse width of the difference pulse signal P3 fed from the pulse signal generator 1C into a digital value and provides it externally; a threshold setting circuit 48 that creates a threshold; and a comparator circuit 50 that receives the digital value and the threshold to compare them with each other and provides an ON/OFF signal based on a magnitude relation therebetween.

The difference pulse signal P3 generated from the pulse signal generator 1C is converted into a digital value corresponding to the pulse width thereof at the pulse width measuring circuit 46. The digital value is provided externally and to the comparator circuit 50. The comparator circuit 50 receives the digital value on one input and the threshold set at the threshold setting circuit 48 on the other input and provides the ON/OFF signal based on the magnitude relation therebetween.

Figure 11:
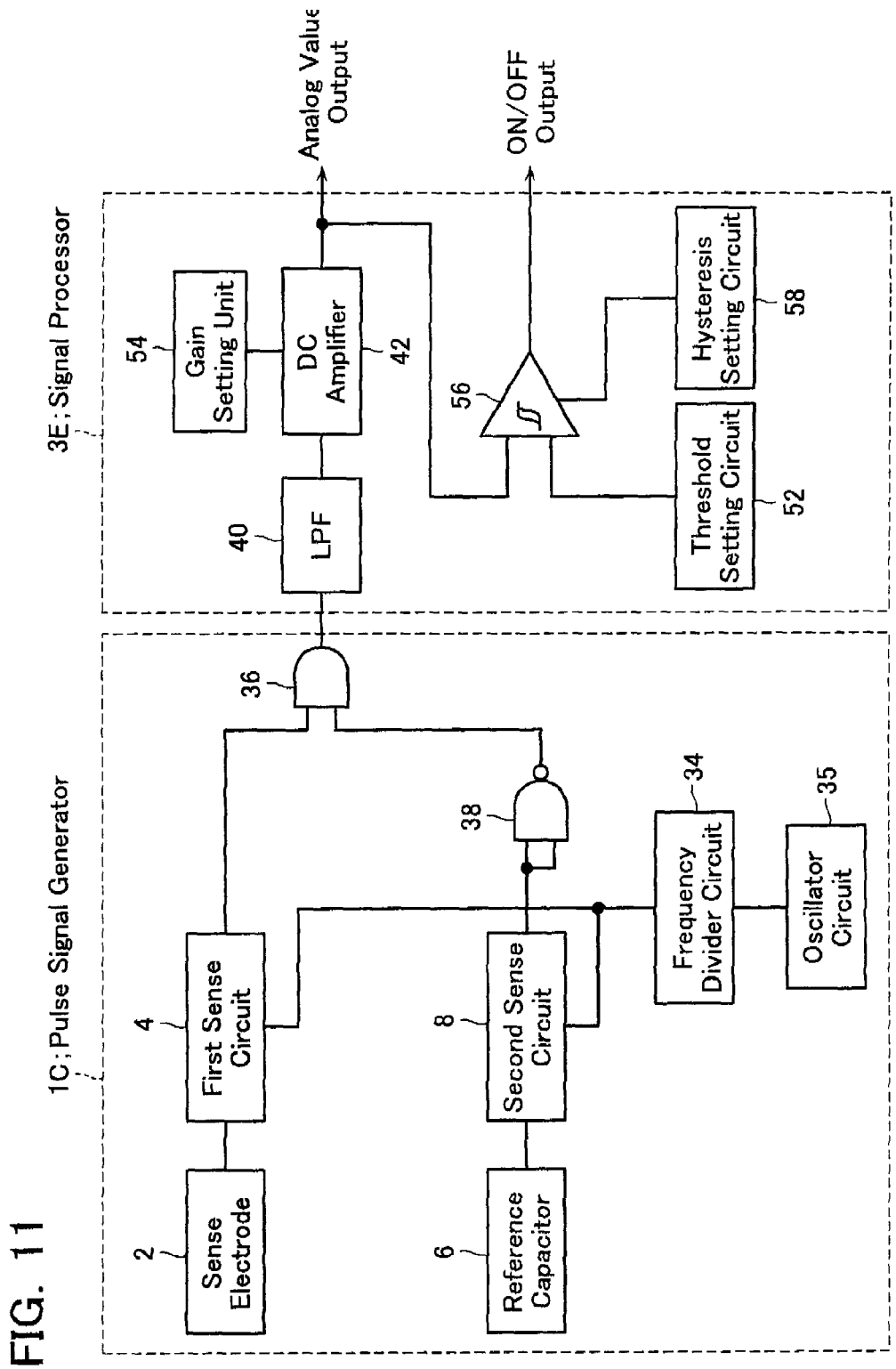
FIG. 11 is a block diagram illustrating an electrical configuration of a proximity sensor according to a sixth embodiment.

FIG. 11 is a block diagram illustrating an electrical configuration of the proximity sensor according to the sixth exemplary a embodiment.

The proximity sensor according to the sixth exemplary embodiment comprises a pulse signal generator 1C and a signal processor 3E. The pulse signal generator 1C has the same configuration as that in the third embodiment.

The signal processor 3E includes a LPF 40 that converts the difference pulse signal P3 generated from the pulse signal generator 1C into a DC signal; a DC amplifier 42 that amplifies the DC signal output from the LPF 40 at the degree of amplification set by a gain setting unit 54; a threshold setting circuit 52; a hysteresis comparator 56 that compares the DC signal amplified through the DC amplifier 42 with the threshold created from the threshold setting circuit 52 and, in accordance with a magnitude relation therebetween, provides an ON/OFF output; and a hysteresis setting circuit 58 that sets a hysteresis characteristic of the hysteresis comparator 56.

The difference pulse signal P3 generated from the pulse signal generator 1C is converted into a DC signal through the LPF 40 and then amplified at the gain set by the gain setting unit 54. The amplified DC signal is provided in externally as an analog signal. In addition, the amplified DC signal is compared with the threshold in the hysteresis comparator 56 and, in accordance with a magnitude relation therebetween, converted into an ON/OFF output. In this exemplary embodiment, the use of the hysteresis comparator 56 additionally improves the noise immunity.

The following description is given to a verification experiment that is performed to verify the effect of the present invention using the proximity sensor according to the sixth exemplary embodiment. In the proximity sensor according to the sixth exemplary embodiment, the pulse signal generator 1C and the signal processor 3E comprise an electronic circuit, and a capacitor of 5 pF is connected as the sense electrode 2, and a capacitor of 3 pF as the reference capacitor 6. The ambient temperature around the proximity sensor thus configured was varied at −40° C., 25° C. and 85° C. to check variations in the analog signal output from the DC amplifier 42. The measurement of the temperature characteristic was performed in two cases: where the second sense circuit 8 is halted and only the first sense circuit 4 is operated to pass a signal; and where the second sense circuit 8 is operated to compute a difference value relative to the signal from the first sense circuit 4. Table 1 indicates the relationship between the ambient temperature and the variation in output value while varying the ambient temperature. The variation is shown with reference to the analog signal value at 25° C.

TABLE 1

|  |  | Temperature (° C.) | | |
| --- | --- | --- | --- | --- |
|  |  | −40 | 25 | 85 |
| First Sense Circuit 4 Only | Output Voltage (V) | 2.3022 | 2.32764 | 2.36876 |
|  | Variation (%) | −1.093 |  | 1.767 |
| Second Sense Circuit 8 Operates | Output Voltage (V) | 1.1198 | 1.12641 | 1.13838 |
|  | Variation (%) | −0.587 |  | 1.063 |

As a result, the analog output values from the proximity sensor according to the present exemplary embodiment at −40° C. and 85° C. are confirmed improved because the variation can be almost halved compared with the analog output value based only on the signal from the first sense circuit 4. The variation in analog output value falls almost within ±1% and the removal of the temperature-caused influence on the proximity sensor was confirmed.

Figure 12:
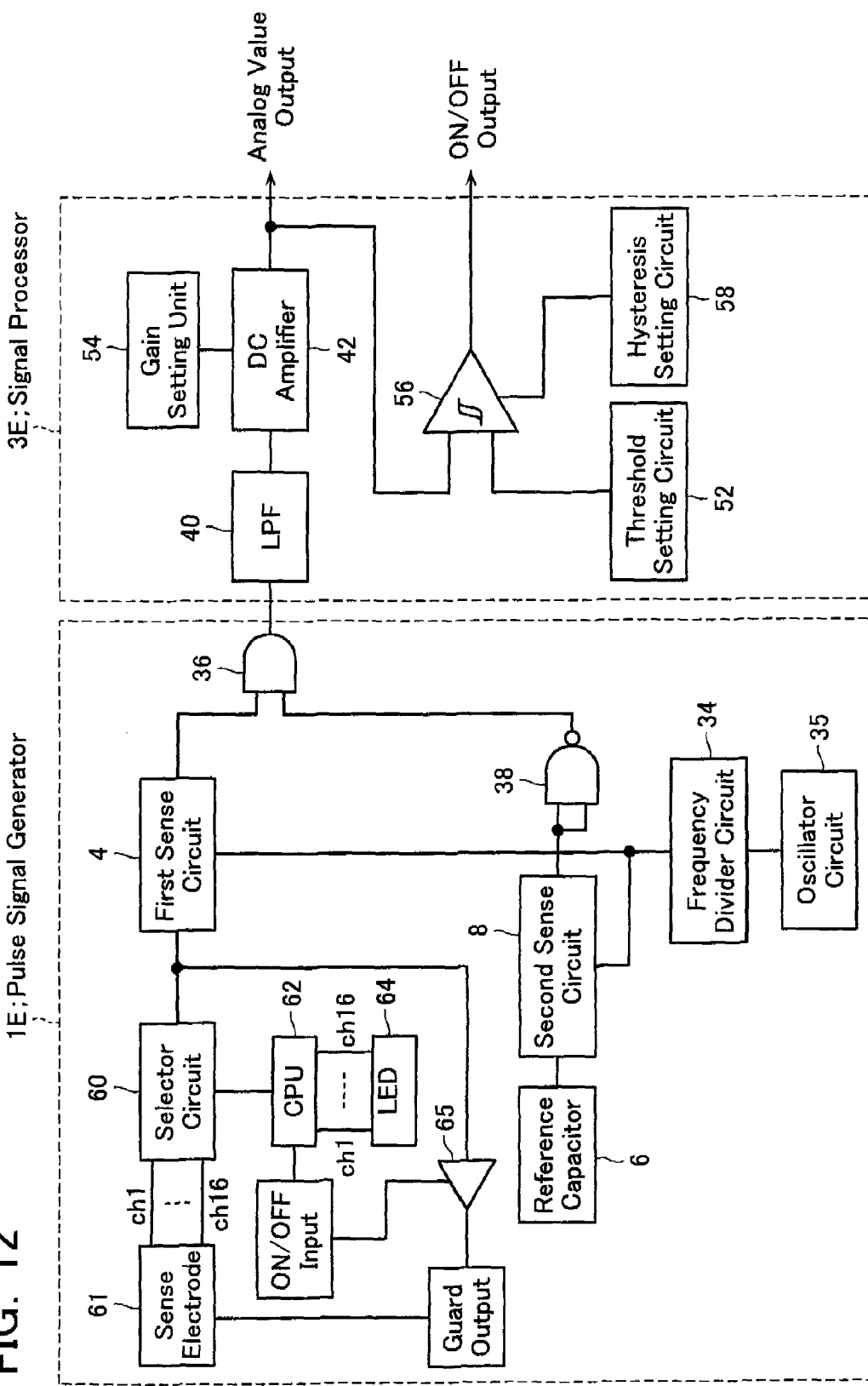
FIG. 12 is a block diagram illustrating an electrical configuration of a proximity sensor according to a seventh exemplary embodiment.

FIG. 12 is a block diagram illustrating an electrical configuration of the proximity sensor according to the seventh exemplary embodiment.

The seventh exemplary embodiment comprises a pulse signal generator 1E and a signal processor 3E. The signal processor 3E has the same configuration as that in the sixth embodiment.

In the pulse signal generator 1E, a sense electrode 61 is connected via a selector circuit 60 to the first sense circuit 4. The selector circuit 60 is connected to a CPU 62 that provides a ch-select signal. The CPU 62 is connected to an LED 64 that is controlled to light on/off by the CPU 62 based on the ON/OFF output.

The pulse signal generator 1E further comprises an opamp 65. The opamp 65 configures a buffer having a gain of one, which keeps the sense electrode 61 and peripherals such as a guard electrode and a shield wire, not shown, at equipotential to prevent charge/discharge between both. The opamp 65 selectively operates in response to the ON/OFF signal.

In the present exemplary embodiment, the CPU 62 provides the ch-select signal to the selector circuit 60. The selector circuit 60 sequentially scans a plurality of electrodes contained in the sense electrode 61 based on the ch-select signal. The signals from the electrodes contained in the sense electrode 61 are sequentially fed into the first sense circuit 4 and provided externally as the sense pulse signal P1. The difference pulse signal P3 generated based on the sense pulse signal P1 and the reference pulse signal P2 output from the second sense circuit 8 is converted into a DC signal through the LPF 40 and the DC amplifier 42 in the signal processor 3E and provided externally as an analog signal. This analog signal output is compared with the threshold in the hysteresis comparator 56. For the electrode of a certain channel in the sense electrode 61 scanned by the selector circuit 60, if an analog signal based on the signal thereof exceeds the threshold, an ON/OFF output is provided. In the present exemplary embodiment, if an analog signal exceeds the threshold, an ON output is provided.

The ON/OFF output is fed to the CPU 62. The CPU 62 turns on the LED 64 with the output corresponding to the channel that has been made ON, thereby providing an indication corresponding to the sensed state of each channel in the sense electrode.

The ON/OFF output is also input to the opamp 65. The opamp 65 provides a guard output to a guard electrode arranged at a surrounding of the sense electrode 61 in accordance with the ON/OFF output.

The following description is given to a verification experiment that is performed to verify the effect of the present invention in the seventh exemplary embodiment of the invention.

Figure 13A:
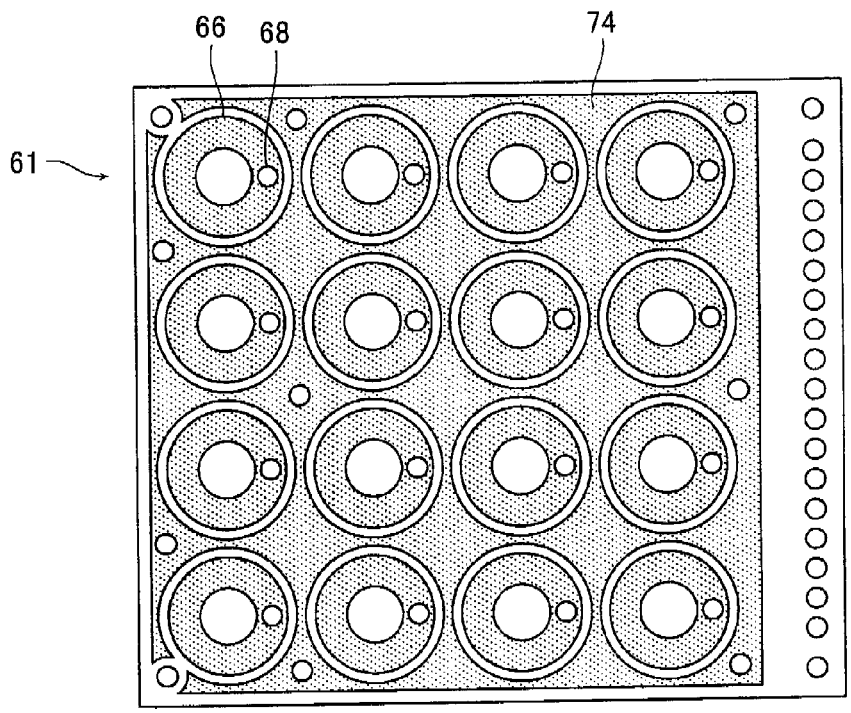
FIGS. 13A and 13B are plan views illustrating a structural example of the sense electrode.
Figure 13B:
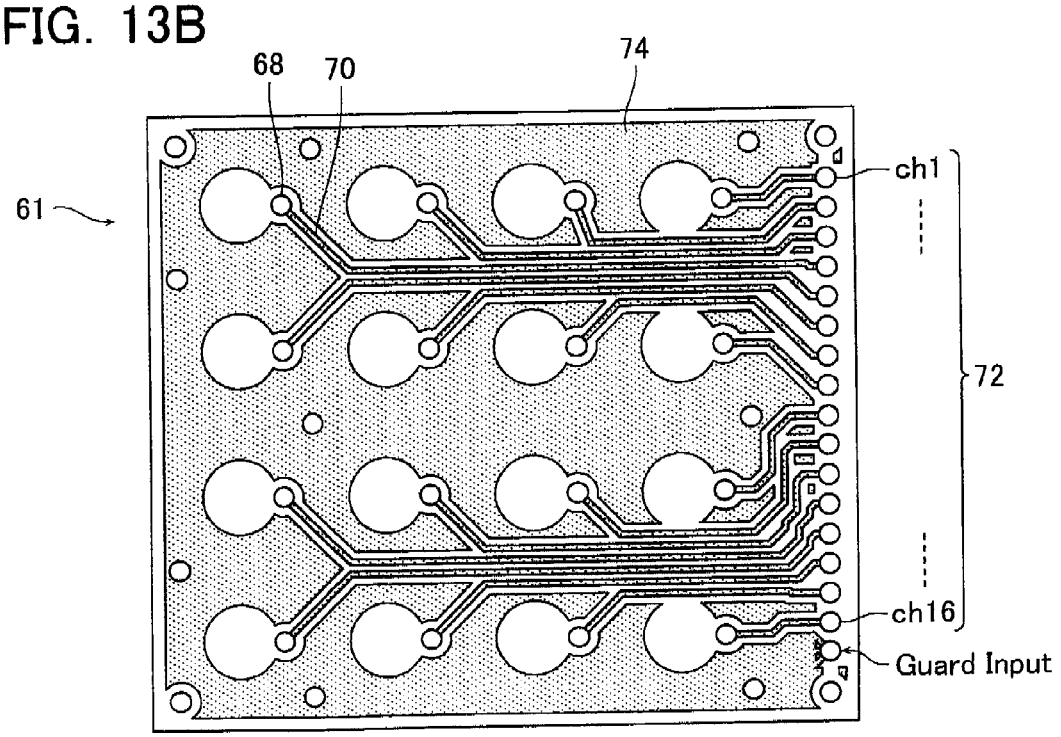

FIG. 13 is a plan view illustrating the sense electrode 61 used in the verification experiment. FIG. 13A shows a front surface of the sense electrode 61 while FIG. 13B shows a rear surface of the sense electrode 61. The sense electrode 61 includes sixteen ring-shaped electrode portions 66 arranged in four rows and four columns on the front surface. Each neighboring electrodes of the electrode portions 66 are arranged at an interval of 2.5 mm. The electrode portions 66 are connected via through-holes 68 to the rear surface of the sense electrode 61 and wired to connection terminals 72 via wires 70. The sixteen channel electrodes of the sense electrode 61 are connected to the selector circuit 60. A guard electrode 74 is arranged at a surrounding of the electrode portions 66 and input the ground output from the opamp.

The present verification experiment employs a 75 kΩ detection resistor for use in the first sense circuit 4 and in the second sense circuit 8. A 56 pF capacitor is used as the reference capacitor 6. The gain set by the gain setting unit 54 for the DC amplifier 42 was two, and the threshold set by the threshold setting circuit 52 was 2.5 V.

In this verification experiment, analog value outputs were measured about a finger-touched electrode and another not-touched electrode, of the sense electrode 61. The above measurement was performed in two cases: where the second sense circuit 8 is halted and only the first sense circuit 4 is operated to pass a signal; and where the second sense circuit 8 is operated to compute a difference value relative to the signal from the first sense circuit 4. Table 2 indicates the relationship between the output voltages from the LPF and the DC amplifier for the finger-touched electrode and the not-touched electrode.

TABLE 2

|  |  | Ch 16 (Finger Touched) | Ch 12 (Not Touched) |
|---|---|---|---|
| First Sense Circuit 4 Only | LPF Output Voltage (V) | 5.0 | 4.4 |
|  | DC Amplifier Output Voltage (V) | 5.0 | 5.0 |
| Second Sense Circuit 8 Operates | LPF Output Voltage (V) | 1.8 | 1.2 |
|  | DC Amplifier Output Voltage (V) | 3.6 | 2.4 |

The analog value outputs from the DC amplifier 42 based on the signal only from the first sense circuit 4 exceed the threshold of 2.5 V, for both the finger-touched electrode and the not-touched electrode, and the ON-output is provided for both cases. Therefore, in this state the proximity sensor can not work.

When the second sense circuit 8 is operated and a subtraction is performed together with the reference pulse signal P2 based on the output from the reference capacitor 6, the analog value outputs from the DC amplifier 42 exhibit different values. When a finger touches the ch-16 electrode in the sense electrode 61, the output voltage exceeds the threshold of 2.5 V and the ON-output is provided. When no finger touches the ch-12 electrode in the sense electrode 61, on the other hand, the output voltage does not exceed the threshold and the OFF-output is provided. In this state, when a finger touches a certain electrode, the ON-output based on the output voltage makes it possible to turn on a certain LED. Therefore, it can work as the proximity sensor that senses proximity of the object.

In the proximity sensor for the verification experiment that operates only the first sense circuit 4, the threshold set at a value equal to 4.4 V or higher and the gain of one set by the gain setting unit enable the discrimination of a finger touch. The upper limit value of the circuit in the signal processor is equal to the supply voltage of 5 V and the use of a value close to this one makes it difficult to insure a design margin. The degree of amplification in the signal processor is hardly increased and accordingly sensing at a much lower sensitivity is impossible.

On the other hand, in the proximity sensor that operates the second sense circuit 8, the analog value output is around ⅔ of the supply voltage that is the measurement upper limit value. Therefore, even when sensing at a relatively low sensitivity, an increased difference or increased amplification enables sensing.

In the verification experiment, the guard electrode 74 is used. In the case of sensing without the guard electrode 74, it may be possible that the electrode portions 66 influence each other. Therefore, the electrode portions 66 and the wire 70 from each electrode to the first sense circuit 4 must be shielded by the ground electrode 74. A GND can be used as the guard electrode 74. The guard electrode may be not used in the case that the electrode portions 66 are arranged separate from each other.

In the proximity sensor of the present exemplary embodiment, even within the finite supply voltage, an operation of subtraction makes an extremely small variation in capacitance sensible.

Figure 14:
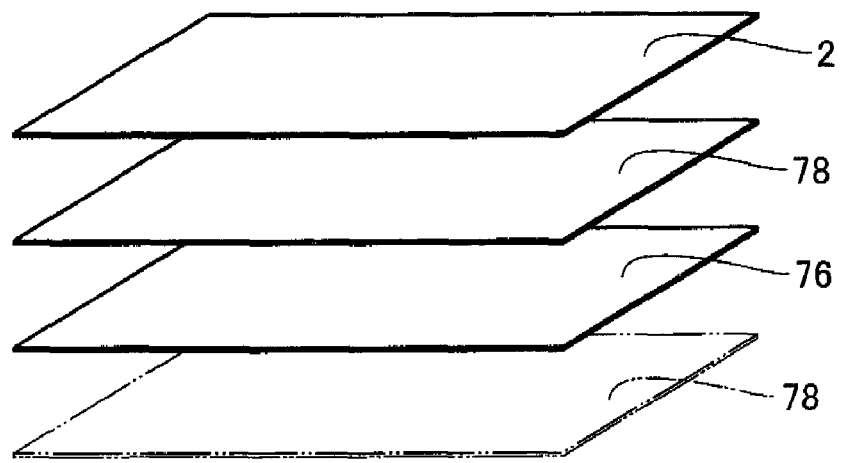
FIG. 14 is a schematic illustrating an example of arrangement of the sense electrode and the reference electrode.

In all the above exemplary embodiments, a reference electrode 76 may be employed instead of the reference capacitor 6. In this case, for example, as shown in FIG. 14, the reference electrode 76 is arranged at the rear of the sense electrode 2 via a shield 78. With such the configuration, the sense electrode 2 varies the detected value in accordance with proximity of the object while the reference electrode 76 provides a reference value unaffected by the proximity of the object. In order to remove the influence of noises exerted on the reference electrode 76 from behind the rear of the reference electrode 76, another shield 78 may be arranged at the rear of the reference electrode 76.

Figure 15:
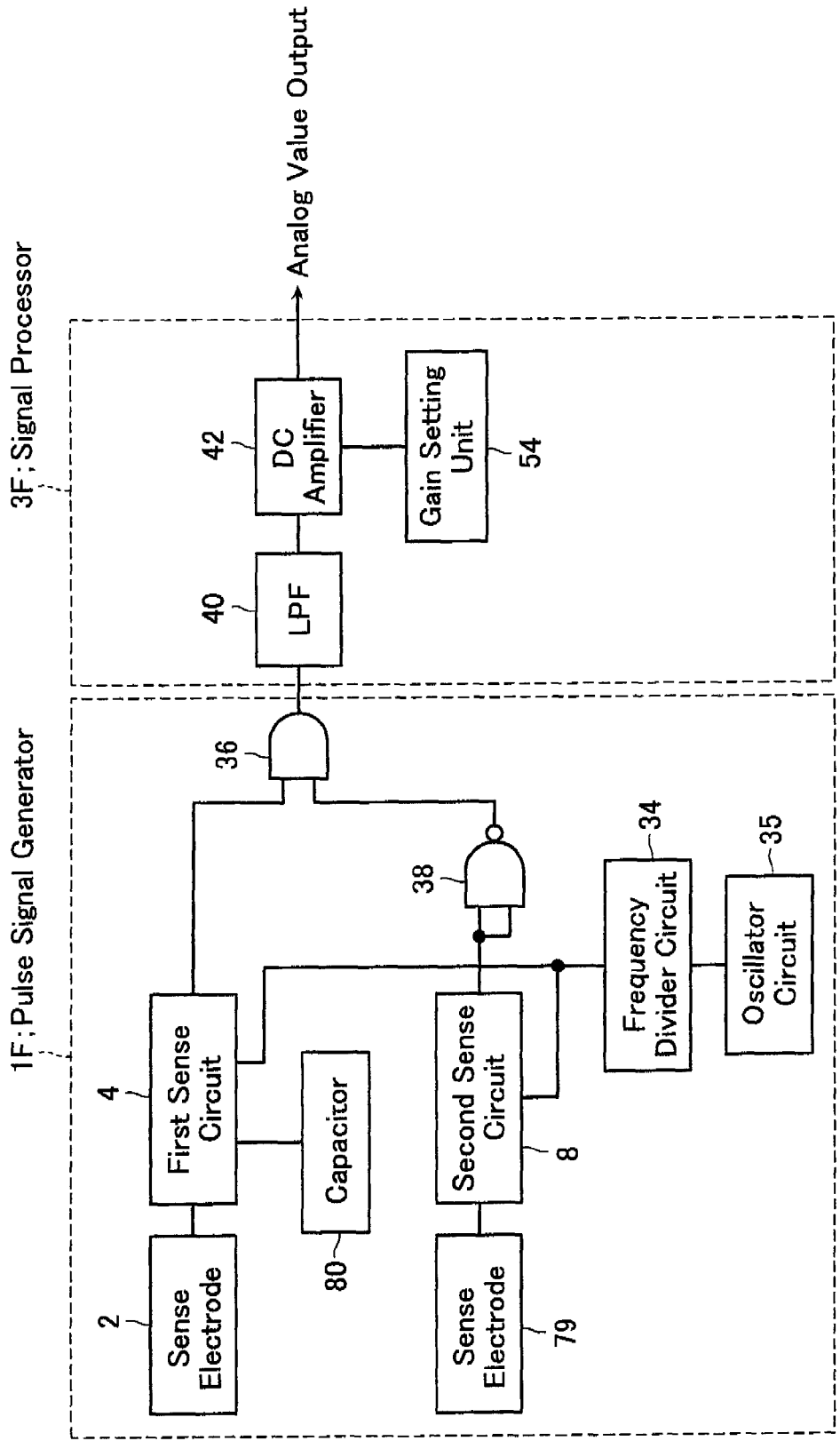
FIG. 15 is a block diagram illustrating an electrical configuration of a proximity sensor according to an eighth exemplary embodiment.

FIG. 15 is a block diagram illustrating an electrical configuration of the proximity sensor according to the eighth exemplary embodiment of the present invention.

The eighth exemplary embodiment comprises a pulse signal generator 1F and a signal processor 3F. The pulse signal generator 1F includes a sense electrode 79 having a capacitance variable in response to proximity of the object, which electrode is employed as a reference electrode instead of the reference capacitor 6 in the third exemplary embodiment, different from the pulse signal generator 1C according to the third exemplary embodiment. In addition, a capacitor 80 is connected to the first sense circuit 4, different from the pulse signal generator 1C according to the third exemplary embodiment. The signal processor 3F has the same configuration as the analog value output section in the signal processor 3E according to the sixth exemplary embodiment.

In the pulse signal generator 1F, the sense electrode 2 is connected to the first sense circuit 4, and the first sense circuit 4 provides the sense pulse signal P1. The capacitor 80 is connected to an input terminal of the first sense circuit 4 to increase the initial capacitance such that even if no object approaches the sense electrode 2 and the sense electrode 79, the outputs therefrom exhibit a mean value of a full-range.

In the pulse signal generator 1F, the sense electrode 79 is connected to the second sense circuit 8. The second sense circuit 8, similar to the first sense circuit 4, converts the capacitance between the sense electrode 79 and the ground into the reference pulse signal P2 and provides it externally. The sense electrode 79 has almost the same initial capacitance as the initial capacitance of the first sense circuit 4 and has a capacitance to the ground variable in response to proximity of an object. The pulse width of the reference pulse signal P2 varies in accordance with the variation in the capacitance.

In the proximity sensor according to the eighth exemplary embodiment, proximity of the object to the sense electrode 2 varies the capacitance of the sense electrode 2 and makes the voltage value or the analog value output higher than the mean value of the full-range. In the above-described first through seventh exemplary embodiments, the reference value output from the reference capacitor 6 is used in the temperature correction that reduces the detected value. The reference capacitor 6 may be replaced by the electrode 79 as shown in the present exemplary embodiment and employed as a second sense electrode. In this case, the ambient environmental variations are in-phase noises and are accordingly cancelled out.

The following description is given to a verification experiment that is performed to verify the effect of the proximity sensor according to the eighth exemplary embodiment. In the pulse signal generator, the sense electrode 2 and the sense electrode 79 each comprise a 50 mm-square piece of copper foil and these two sense electrodes are arranged at an interval of 20 mm. An acrylic plate with a thickness of 1 mm is disposed over each sense electrode. A 20 pF capacitor is connected to the input terminal of the first sense circuit 4. The output voltage from the proximity sensor thus configured was measured in a state in which no finger touches the sense electrodes and in a state in which a finger touches the sense electrode(s).

In this verification experiment, the output voltage in the state in which no finger touches both electrodes and the output voltage in the state in which a finger touches the sense electrode(s) are compared as shown in Table 3.

TABLE 3

| NO. | State | Output Voltage (V) | Difference (V) from State 1 |
|---|---|---|---|
| 1 | Nothing Touches Both Electrodes | 2.284 | |
| 2 | Finger Touches Electrode 2 | 2.587 | +0.303 |
| 3 | Finger Touches Electrode 79 | 1.952 | −0.332 |
| 4 | Finger Touches Both Electrodes | 2.240 | −0.044 |

As a result, it is confirmed that the variation in output can be measured sufficiently when the sense electrode 2 and the sense electrode 79 are touched separately. The variation in output when both the electrodes are touched almost matches the difference value between the variations in output when the electrodes are touched separately. Therefore, the proximity sensor may be configured to notice a non-sensed state when both the sense electrodes are touched simultaneously. Such the proximity sensor may also be configured without the use of the capacitor that increases the initial capacitance.

The exemplary embodiments of the present invention have been described above though the present invention is not limited to these exemplary embodiments but rather can be given various modifications and additions without departing from the spirit and scope of the invention.

For example, the trigger signal generator circuit 10 has been configured using the oscillator circuit capable of internally oscillating though it may be configured to receive a sample synchronous signal supplied from external.

What is claimed is:

1. A proximity sensor, comprising:
   a sense electrode having a first capacitance to ground, wherein the first capacitance varies in response to proximity of an object to be sensed;
   a first sense circuit which provides a first pulse signal having a pulse width determined in accordance with said first capacitance;
   a reference capacitor having a second capacitance which does not vary in response to proximity of the object to be sensed to the sense electrode, wherein the reference capacitor has an environmental characteristic equal to that of the sense electrode;
   a second sense circuit which provides a second pulse signal having a pulse width determined in accordance with the second capacitance of said reference capacitor;

a computing circuit which computes a difference pulse width by subtracting said second pulse signal from said first pulse signal and provides a pulse having said difference pulse width; and a delay circuit which delays said first pulse signal relative to said second pulse signal.

2. The proximity sensor according to claim 1, wherein said second pulse signal output from said second sense circuit has an initial pulse width equal to the initial pulse width of said first pulse signal output from said first sense circuit.

3. The proximity sensor according to claim 1, further comprising a trigger signal generator circuit which synchronizes rising edges of said first pulse signal and said second pulse signal with each other.

4. The proximity sensor according to claim 1, further comprising:

a low-pass filter which converts said difference pulse into a DC signal; and a DC amplifier which amplifies said DC signal created through said low-pass filter.

5. The proximity sensor according to claim 1, wherein said sensor compares said pulse width of said difference pulse with a threshold and provides an ON/OFF signal based on a magnitude relation therebetween.

6. The proximity sensor according to claim 1, wherein said sense electrode is one of a plurality of such sense electrodes, and said sensor further comprises a selector circuit which selects one signal from said plurality of sense electrodes and feeds said one signal to said first sense circuit.

7. A proximity sensor, comprising:

a sense electrode having a first capacitance to ground, wherein said first capacitance varies in response to proximity of an object to be sensed;

a first sense circuit which provides a first pulse signal having a pulse width determined in accordance with said first capacitance;

a reference electrode having a second capacitance which does not vary in response to proximity of the object to be sensed to the sense electrode, wherein the reference electrode has an environmental characteristic equal to that of the sense electrode;

a second sense circuit which provides a second pulse signal having a pulse width determined in accordance with the second capacitance between said reference electrode and ground;

a computing circuit which computes a difference pulse width by subtracting said second pulse signal from said first pulse signal and provides a pulse having said difference pulse width; and a delay circuit which delays said first pulse signal relative to said second pulse signal.

8. The proximity sensor according to claim 7, wherein said second pulse signal output from said second sense circuit has an initial pulse width equal to the initial pulse width of said first pulse signal output from said first sense circuit.

9. The proximity sensor according to claim 7, further comprising a trigger signal generator circuit which synchronizes rising edges of said first pulse signal and said second pulse signal with each other.

10. The proximity sensor according to claim 7, further comprising:

a low-pass filter which converts said difference pulse into a DC signal; and a DC amplifier which amplifies said DC signal created through said low-pass filter.

11. The proximity sensor according to claim 7, wherein said sensor compares said pulse width of said difference pulse with a threshold and provides an ON/OFF signal based on a magnitude relation therebetween.

12. The proximity sensor according to claim 7, wherein said sense electrode is one of a plurality of such sense electrodes, and said sensor further comprises a selector circuit which selects one signal from said plurality of sense electrodes and feeds said one signal to said first sense circuit.

13. A proximity sensing method, comprising:

receiving a first pulse signal output from a first sense circuit, said first pulse signal having a first pulse width determined in accordance with a first capacitance between a sense electrode and ground, wherein said first capacitance varies in response to proximity of an object to be sensed and ground to measure said first pulse width;

receiving a second pulse signal output from a second sense circuit, said second pulse signal having a second pulse width determined in accordance with a second capacitance of a reference capacitor to measure said second pulse width, wherein said second capacitance does not vary in response to proximity of the object to be sensed to the sense electrode, wherein said reference capacitor has an environmental characteristic equal to that of the sense electrode;

delaying said first pulse signal relative to said second pulse signal; and computing a difference pulse by subtracting said second pulse width of said second pulse signal from said first pulse width of said first pulse signal and providing a pulse of said difference pulse width.

14. A proximity sensing method, comprising:

receiving a first pulse signal output from a first sense circuit, said first pulse signal having a first pulse width determined in accordance with a first capacitance between a sense electrode and ground, wherein said first capacitance is variable in response to proximity of an object to be sensed and ground to measure said first pulse width;

receiving a second pulse signal output from a second sense circuit, said second pulse signal having a second pulse width determined in accordance with a second capacitance between a reference electrode and ground to measure said second pulse width, wherein said second capacitance does not vary in response to proximity of the object to be sensed to the sense electrode, wherein said reference electrode has an environmental characteristic equal to that of the sense electrode;

delaying said first pulse signal relative to said second pulse signal; and computing a difference pulse by subtracting said second pulse width of said second pulse signal from said first pulse width of said first pulse signal and providing a pulse of said difference pulse width.

* * * * *